(12) United States Patent
Yu

(10) Patent No.: US 6,476,549 B2
(45) Date of Patent: Nov. 5, 2002

(54) LIGHT EMITTING DIODE WITH IMPROVED HEAT DISSIPATION

(76) Inventor: Mu-Chin Yu, 3F, No. 117, Yan-Shou Road, Tu Cheng, Taipei Hsien (TW)

( * ) Notice: Subject to any disclaimer, the term of this patent is extended or adjusted under 35 U.S.C. 154(b) by 0 days.

(21) Appl. No.: 09/729,820

(22) Filed: Dec. 6, 2000

(65) Prior Publication Data

US 2002/0050779 A1 May 2, 2002

(30) Foreign Application Priority Data

Oct. 26, 2000 (TW) ....................................... 89218627 U
Nov. 14, 2000 (TW) ....................................... 89219690 U

(51) Int. Cl.⁷ ................................................. H01J 1/62
(52) U.S. Cl. ...................................................... 313/499
(58) Field of Search .......................... 257/99, 675, 676, 257/98, 100; 313/499, 512

(56) References Cited

U.S. PATENT DOCUMENTS

| | | | | |
|---|---|---|---|---|
| 4,203,792 A | * | 5/1980 | Thompson | 257/80 |
| 4,255,688 A | * | 3/1981 | Nagasawa | 313/499 |
| 4,642,419 A | * | 2/1987 | Meddles | 257/692 |
| 5,345,106 A | * | 9/1994 | Doering et al. | 257/675 |
| 5,825,054 A | * | 10/1998 | Lee et al. | 257/98 |
| 5,998,925 A | * | 12/1999 | Shimizu et al. | 313/498 |

* cited by examiner

Primary Examiner—Neil Abrams
(74) Attorney, Agent, or Firm—Troxell Law Office PLLC

(57) ABSTRACT

An light emitting diode with improved heat dissipation has a frame, a chip, a wire solder, and sealing compound. The frame is integrally made of conductive metal sheet and provides two sets of connecting pins with two connecting pins for each set. A middle connection has two connecting pins and a middle plate has two connecting pins. A recess cup located in the middle part of the middle plate. The chip is placed and located in said recess cup and a conductive wire is joined to the chip and to the middle connection. The sealing compound covers the chip, the wide part of the plate connection and part of the middle plate and forms a light head on top of the chip. The middle plate has a width greater than that of said connecting pins and middle connection and a lower portion of the middle plate is exposed outside the sealing compound for a better dissipation of heat.

7 Claims, 15 Drawing Sheets

LIGHT EMITTING DIODE WITH IMPROVED HEAT DISSIPATION

BACKGROUND OF THE INVENTION

1. Field of the Invention

The present invention relates to an improved light emitting diode, and particularly to a light emitting diode, which provides a base with a bottom part thereof free from sealing and exposing outside for a better heat dissipation.

2. Description of Related Art

A light emitting diode has been used as an effective light source for years. The light emitting diode provides advantages such as a longer life span, a higher lightness and lower power consumption such that it is widely applied in a signaling light, a brake light on a car, a Christmas decorative light, and etc. In addition, the light emitting diode can provide an effect of instant flash by way of circuit design as desired. Therefore, the light emitting diode is popularly used and there is a tendency for the light emitting diode to replace the conventional tungsten lamp.

As shown in FIG. 1, a typical light emitting diode provides at least two connecting pins "A" as a positive pole and a negative pole respectively. A base "B" is disposed above one of the poles at a lateral side thereof to receive a crystal chip "C", and a brazed wire connects a nodal plate "E" extended from the other pole to constitute a circuit. The above said pins "A", base "B", nodal plate "E" are made of conductive sheet metal, and, in practice, are produced by way of integrally punch pressing a strip of conductive sheet metal.

As shown in FIG. 2, a blank sheet used for a prior art light emitting diode is illustrated. It can be seen that the blank sheet has been punch pressed to form a plurality of blank sections. Each blank section has connecting pins "A", the base "B", and the nodal plate "E", and the base "B" has a shape of concave inward cone. The rest unnecessary parts are cut out as removals.

As shown in FIG. 3, a bent blank is illustrated. Each connecting pin "A" in the respective blank section is bent into an angle of 90 degrees with respect to the base "B" and the nodal plate "E", and then the nodal plate "E" and the chip "C" can be connected with each other via a brazed wire "D".

In order to assure a protection for all parts related to the circuit, each blank section are insulated by way of sealing compound. As shown in FIG. 4, a hold fixture is provided with recessions to fit with pattern frames "F". Each blank section is received in each pattern frame "F" and fits with the pattern frame such that the base "B" and the nodal plate "E" are disposed in the pattern frame. Then, the transparent sealing compound such as epoxy resin is poured into each pattern frame "F" to be flush with the upper surface of the pattern frame "F". When the poured sealing compound is solidified, the sealed blank sections are taken out and apart from the pattern frames "F" respectively. Finally, the sealed blank sections are separate into individual light emitting diodes and each of the light emitting diodes is like the one shown in FIG. 1. As shown in FIG. 1, the base "B" is completely covered by the sealing compound and insulated from the outside and the parts above the base "B" are in a state of being sealed to insulate from the outside either.

Once the light emitting diode is started in a state of on instantaneously, an instantaneous current consumption is great so as to generate a higher temperature in the light emitting diode. When the light emitting diode is kept "on" for a long period of time, the heat generated from both of the chip and the wire solder is unable to release outward and results in a phenomenon of minor flaming. In this way, the durability of the light emitting diode may be influenced substantially.

In order to disclose a way overcoming the preceding defects in the prior art, the inventor has filed at the Chinese Patent Office and has been assigned Application No. 00107611.6 entitled "Light Emitting Diode and Making Method with Blank Thereof". (The same invention also has been filed as a European Patent Application No. 00111453 and a U.S. patent application Ser. No. 09/583,236 respectively).

SUMMARY OF THE INVENTION

An object of the present invention is to provide an improved light emitting diode, with which the heat generated therein may transmitted through exposed connecting pins to ease the heat dissipation.

BRIEF DESCRIPTION OF THE DRAWINGS

The present invention can be more fully understood by referring to the following description and accompanying drawing, in which.

DETAILED DESCRIPTION OF THE PREFERRED EMBODIMENTS

Referring to FIGS. 5 to 8, the first embodiment of a light emitting diode according to the present invention basically comprises a frame 1 of a blank sheet, a crystal chip (or a crystal grain) 2, a wire solder 3, and sealing compound 4.

Figure 1:
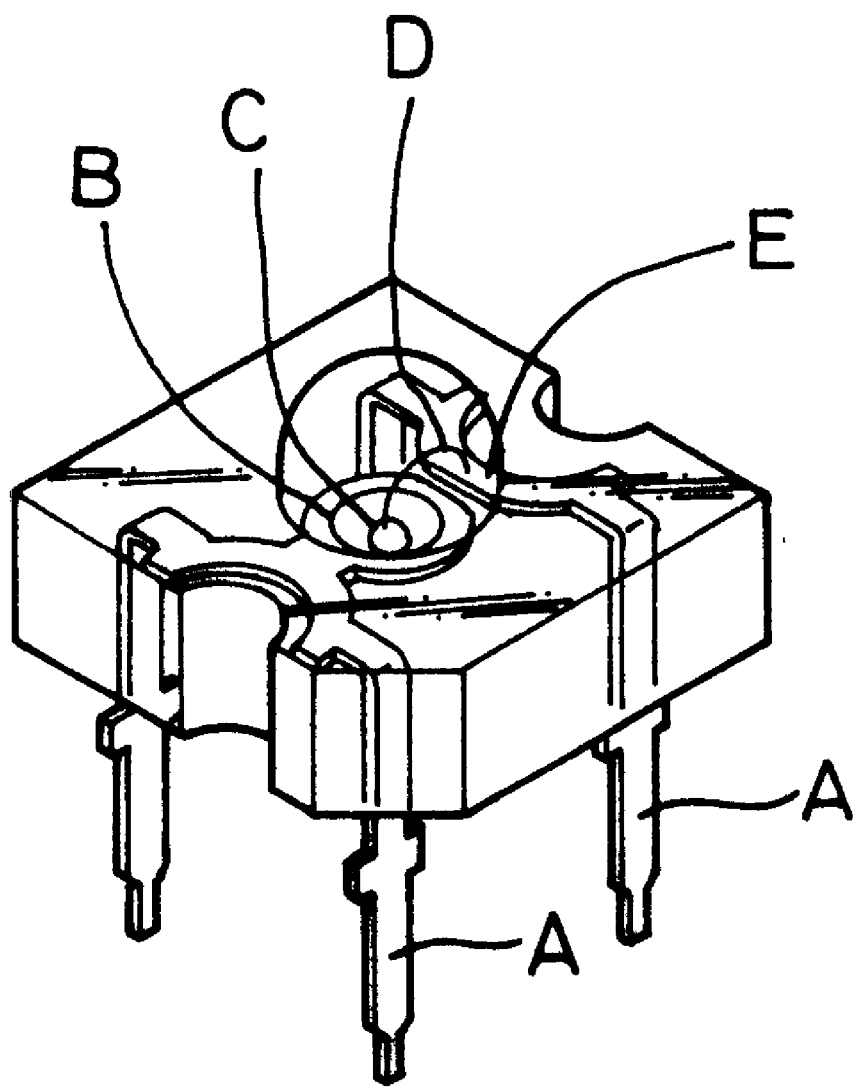
FIG. 1 is a perspective view of a conventional light emitting diode.
Figure 2:
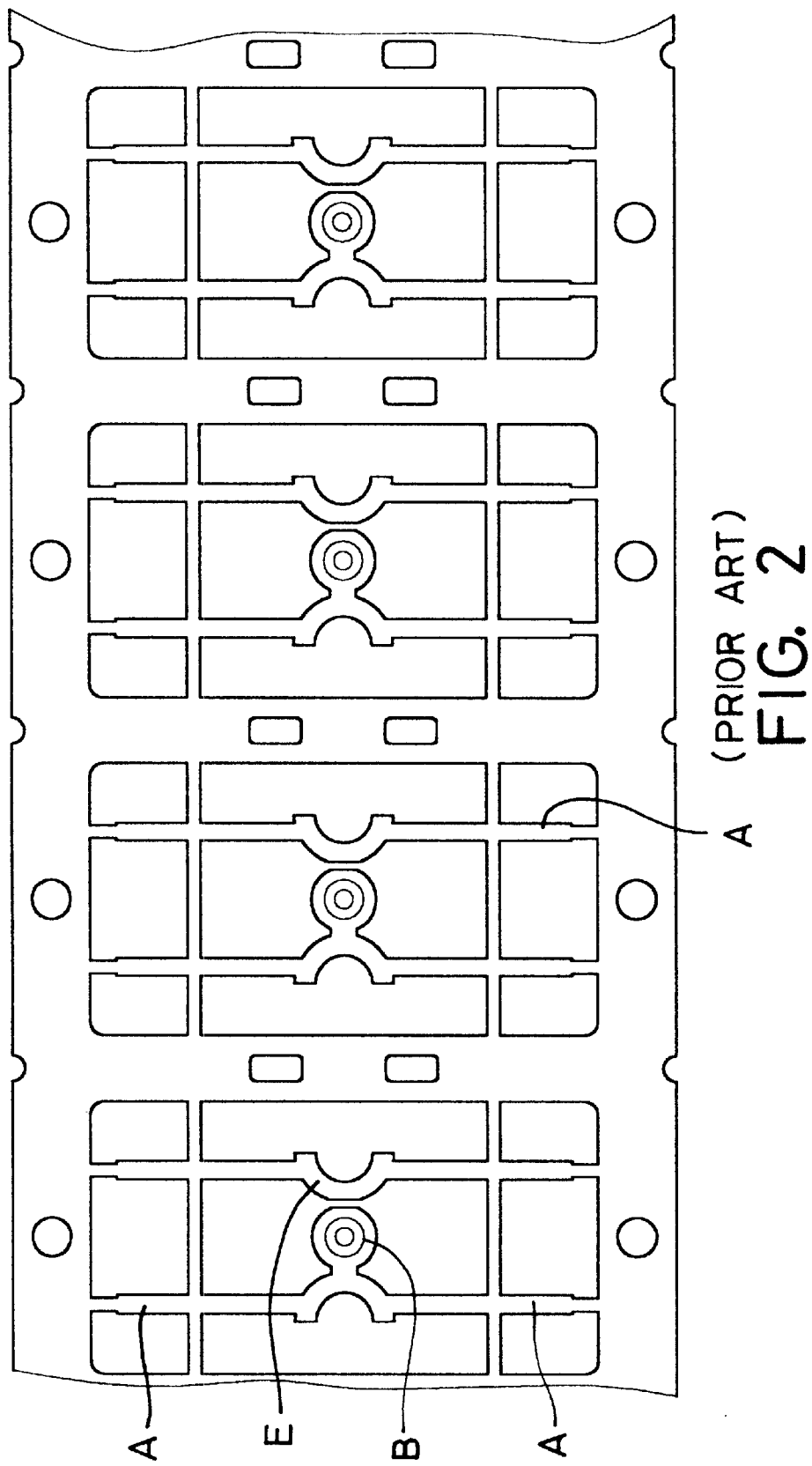
FIG. 2 is a fragmentary plan view of a blank of a conventional light emitting diode after being stamped.
Figure 3:
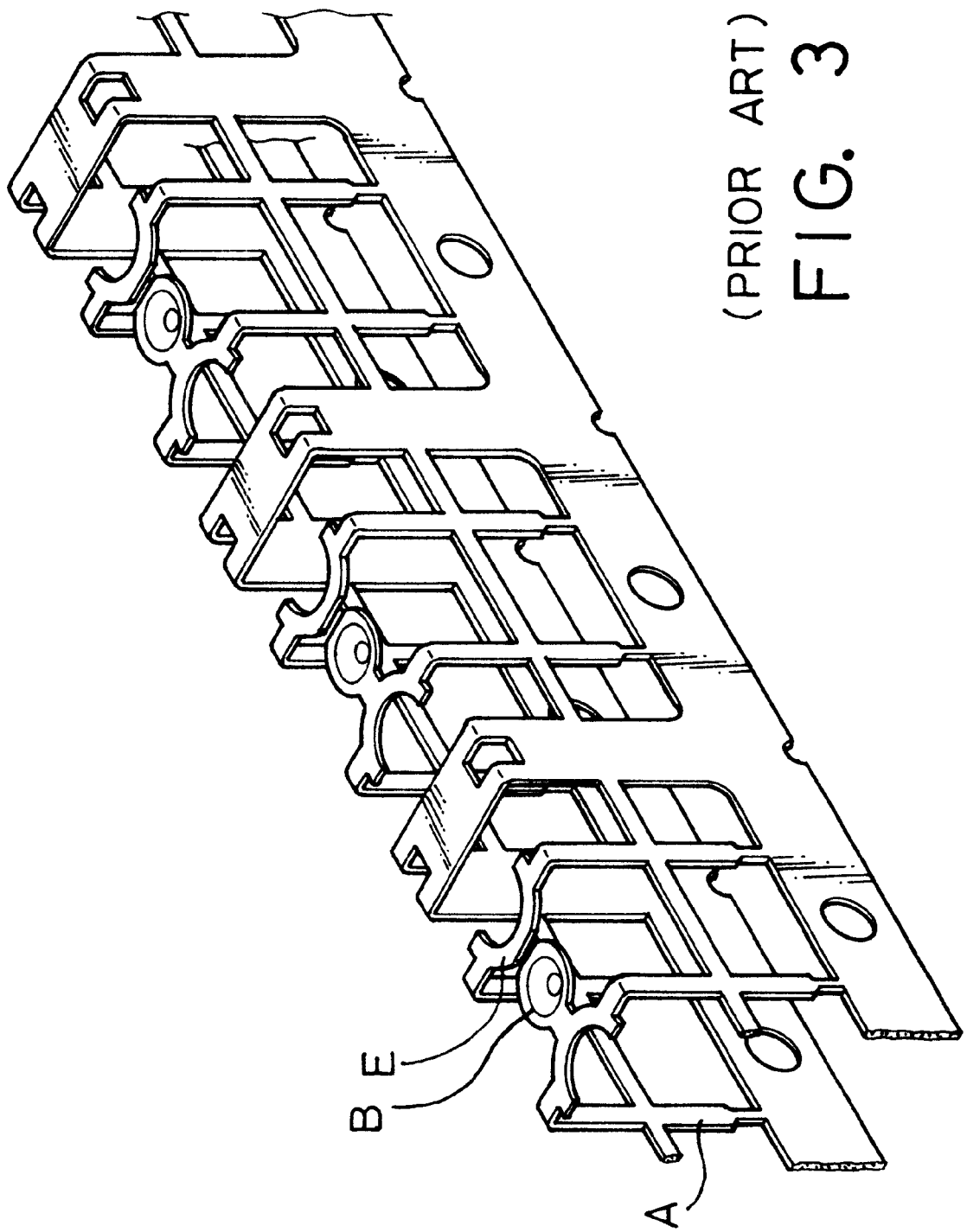
FIG. 3 is perspective view of a bent blank of a conventional light emitting diode.
Figure 4:
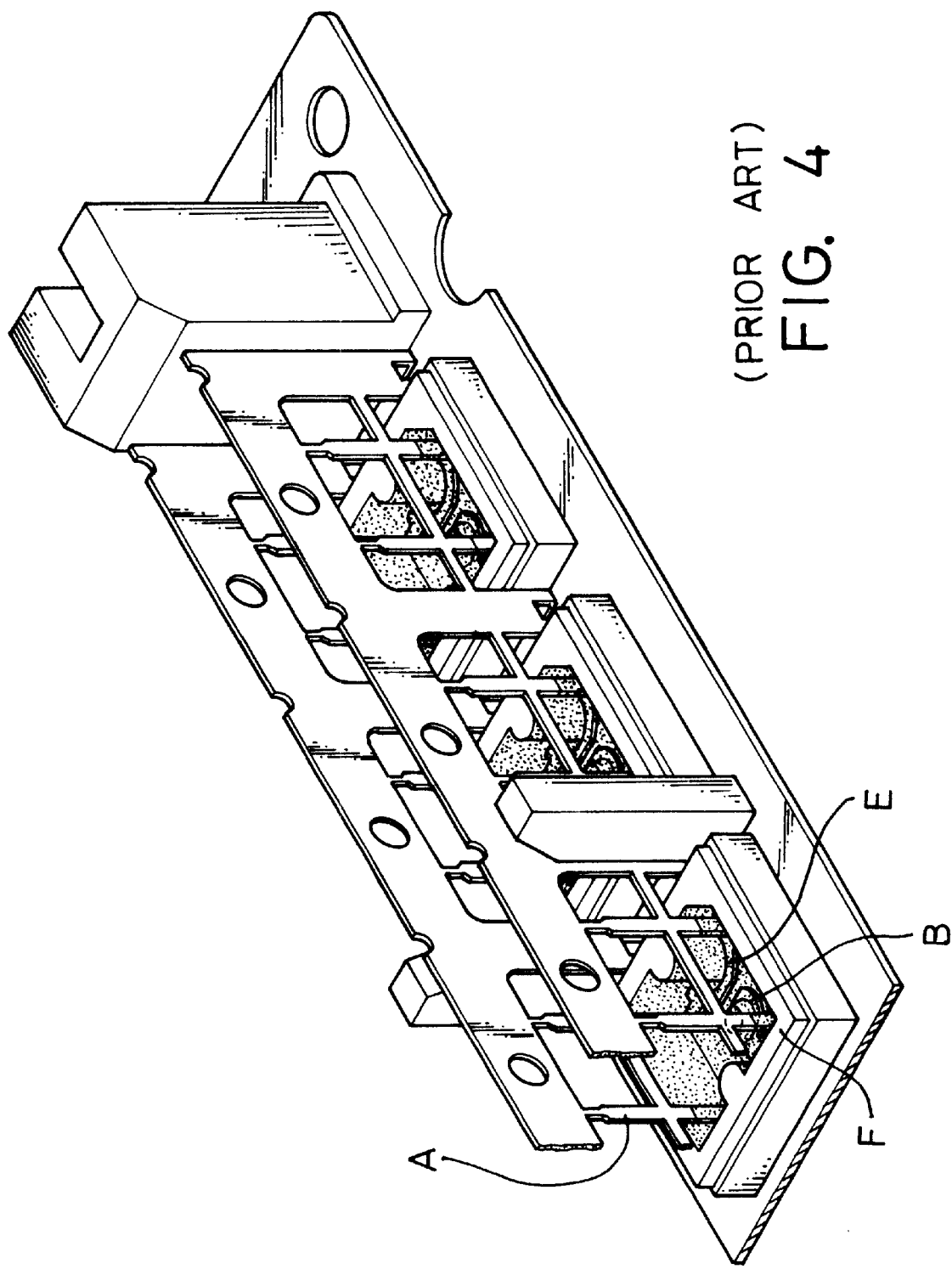
FIG. 4 is a perspective view of the bent blank shown in FIG. 3 in a process of sealing.
Figure 5:
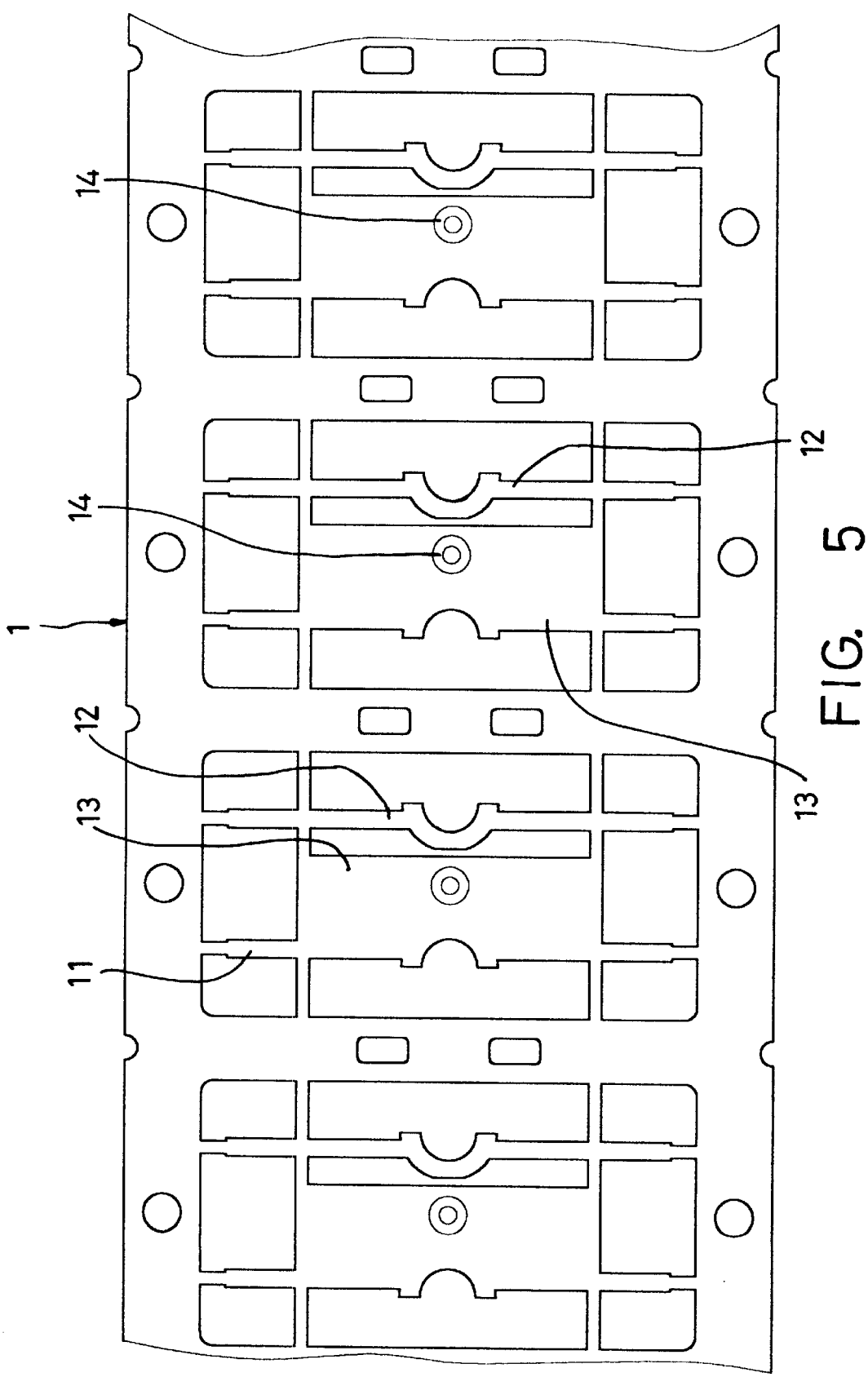
FIG. 5 is a plan view of a blank sheet of a light emitting diode according to the present invention.
Figure 6:
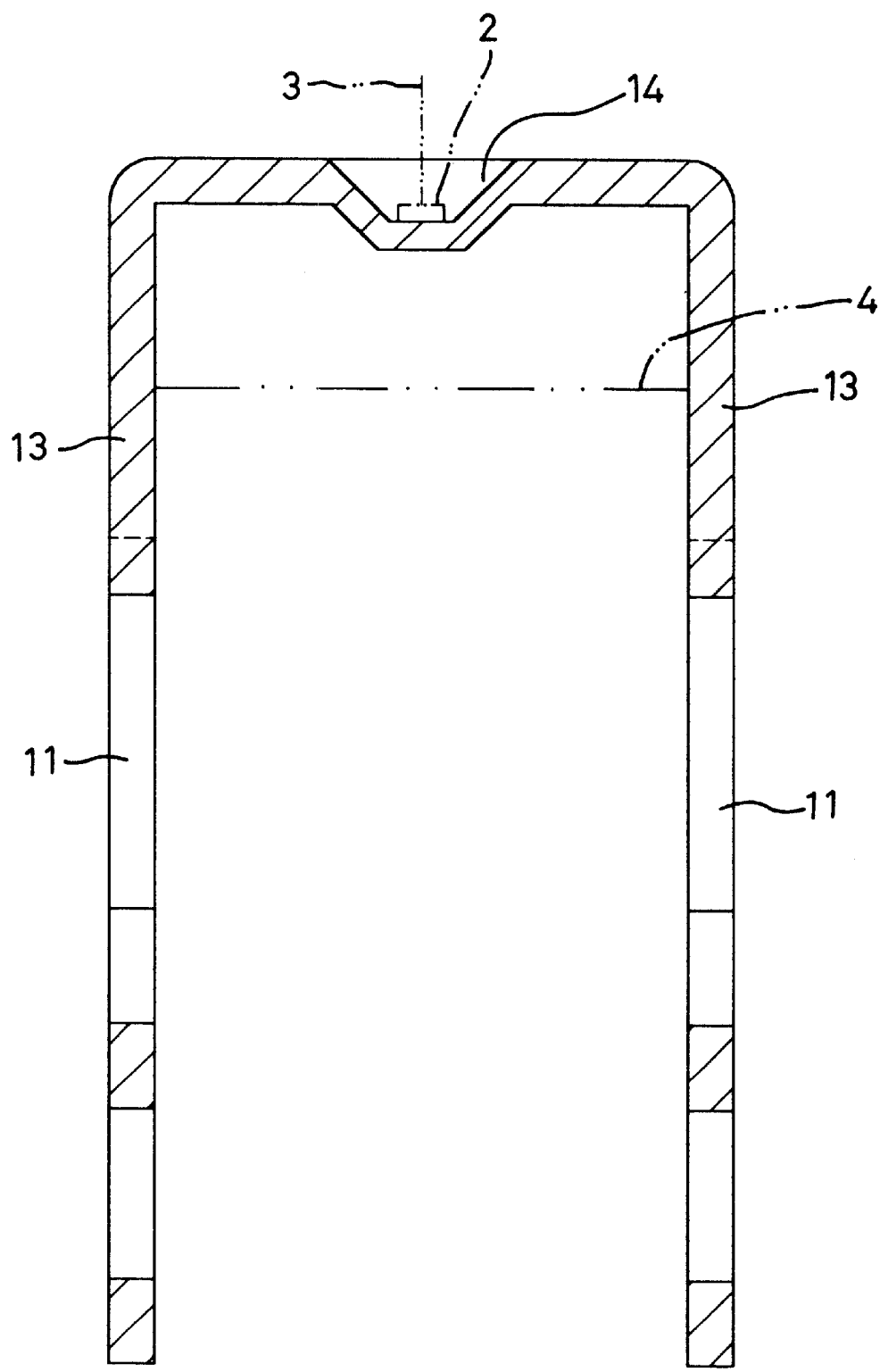
FIG. 6 is a sectional view of the blank sheet shown in FIG. 5 after being bent.

The frame 1 as shown in FIG. 5 is made of an elongated conductive sheet metal being continuously formed integrally by way of punch. Four connecting pins 11 being constituted in the process of punching are divided into two sets and one set thereof have a middle connection 12. The middle connection 12 at the central section thereof may have a circular arc but not required. Another set of connecting pins 11 is provided with a wider plate connection 13 and the middle part of the plate connection 13 is punched a recess cup 14 for placing a chip 2. As shown in FIG. 6, connecting pins 11 are vertically bent downward at margins of the middle connection 12 and the plate connection 13 respectively.

The chip 2, which is the prior art, is placed in the recess cup 14.

The wire solder 3 is made of conductive metal wire and joined to the middle connection 12 and the chip 2 by way of soldering machine to constitute a closed circuit.

Figure 7:
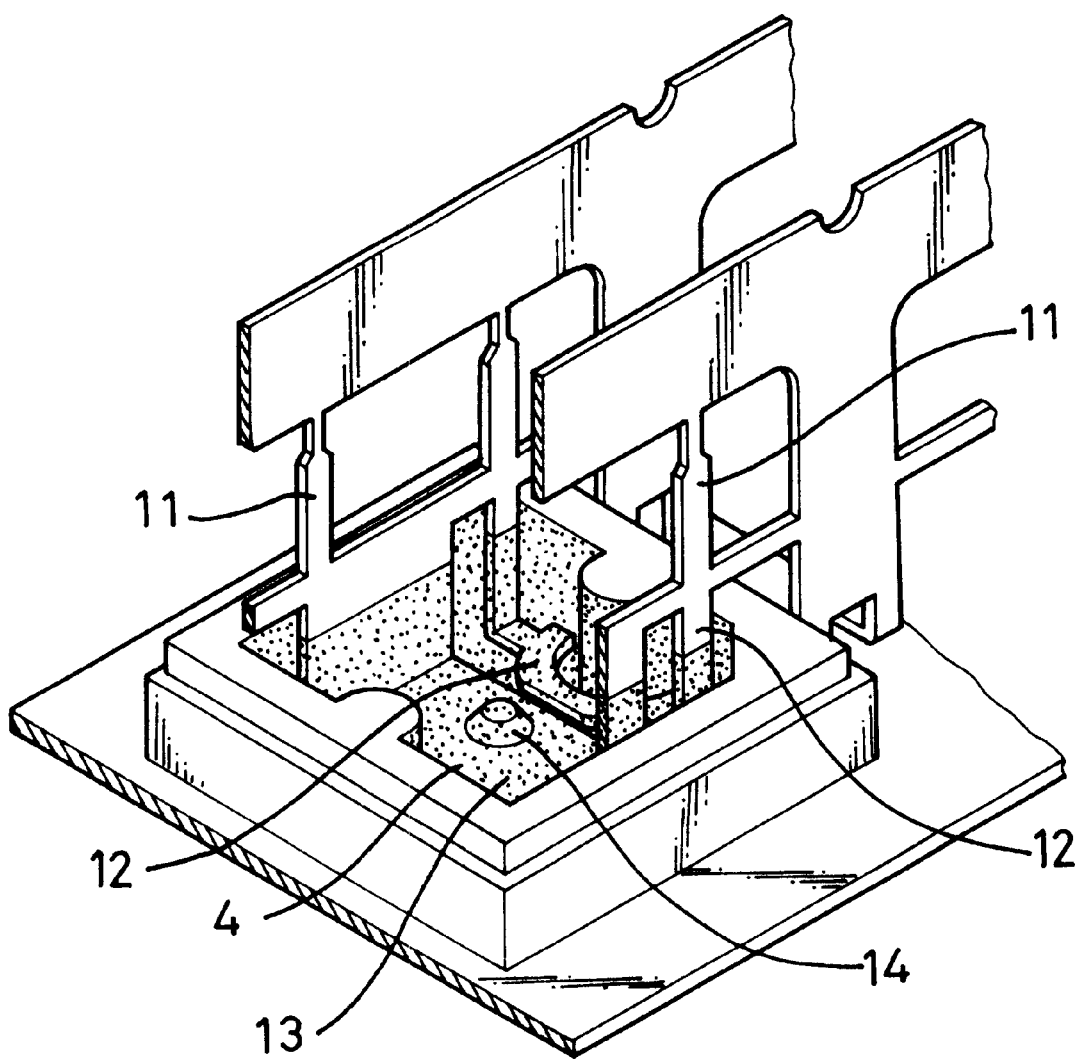
FIG. 7 is a fragmentary perspective view of the light emitting diode of the present invention in the process of sealing.
Figure 8:
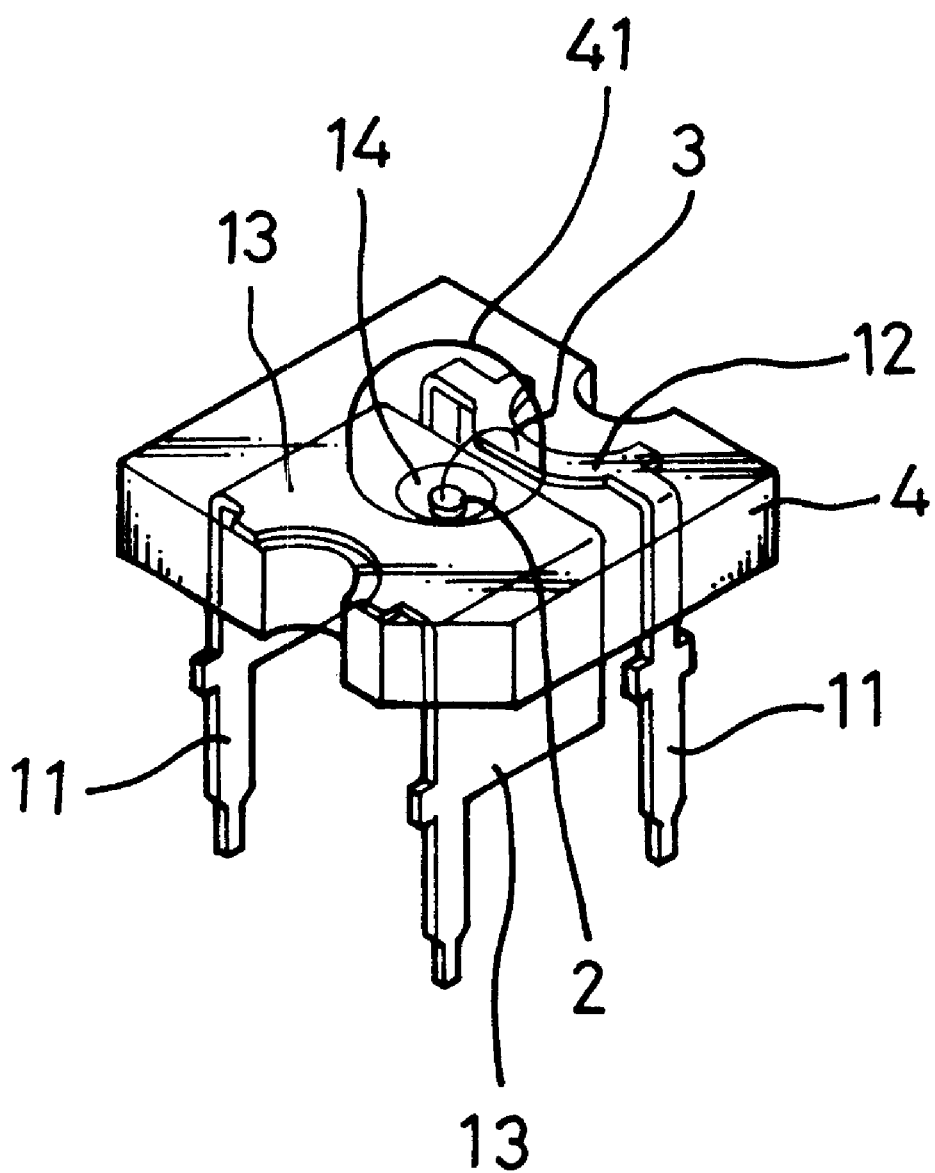
FIG. 8 is a perspective view of the finished light emitting diode of the present invention.

The sealing compound 4 is made of insulation material and tightly covers the chip 2, the wire solder 3, part of the plate connection and part of the middle connection 12 as shown in FIG. 7. Hence, the connecting pins are left uncovered and exposed outside. In addition, the sealing compound at the top thereof is formed a light head 41 and the light head 41 may be a shape of semi-ellipse as shown in FIG. 8. But it is not a restriction to have to be the shape of semi-ellipse.

Referring to FIG. 8 again, the finished light emitting diode of the present invention has the upper portions of the middle connection 12 and the plate connection 13 sealed by and the lower portions thereof expose outside for heat dissipation. It can be understood that the transmission speed of heat is proportional to the transmitted area on which the heat may dissipate, that is, the larger transmitted area the plate connection 13 has, the faster speed of heat dissipation can be reach. Because the plate connection 13 has a width greater than that of the prior art and the lower portion thereof is exposed outside, a superior effect of heat dissipation can be obtained substantially.

Referring to FIGS. 9 to 13, a second embodiment of the present invention is illustrated. The light emitting diode in the second embodiment comprises a frame 5 composed of the blank sheet, a support or heat sink 6, a crystal chip 7 (or crystal grain), a wire solder 8, and sealing compound 9.

Figure 9:
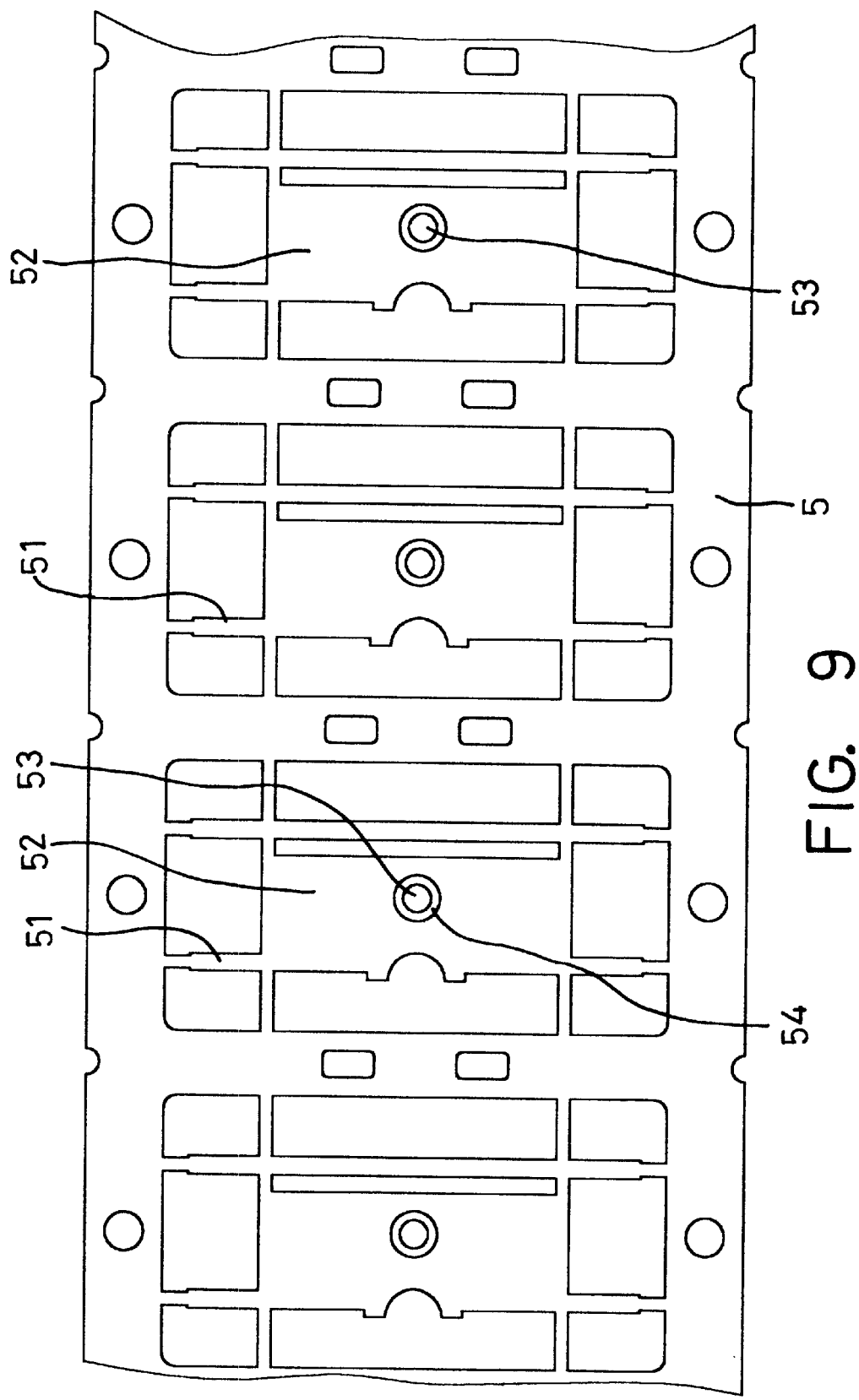
FIG. 9 is a plan view of a blank sheet in a second embodiment of the present invention.
Figure 10:
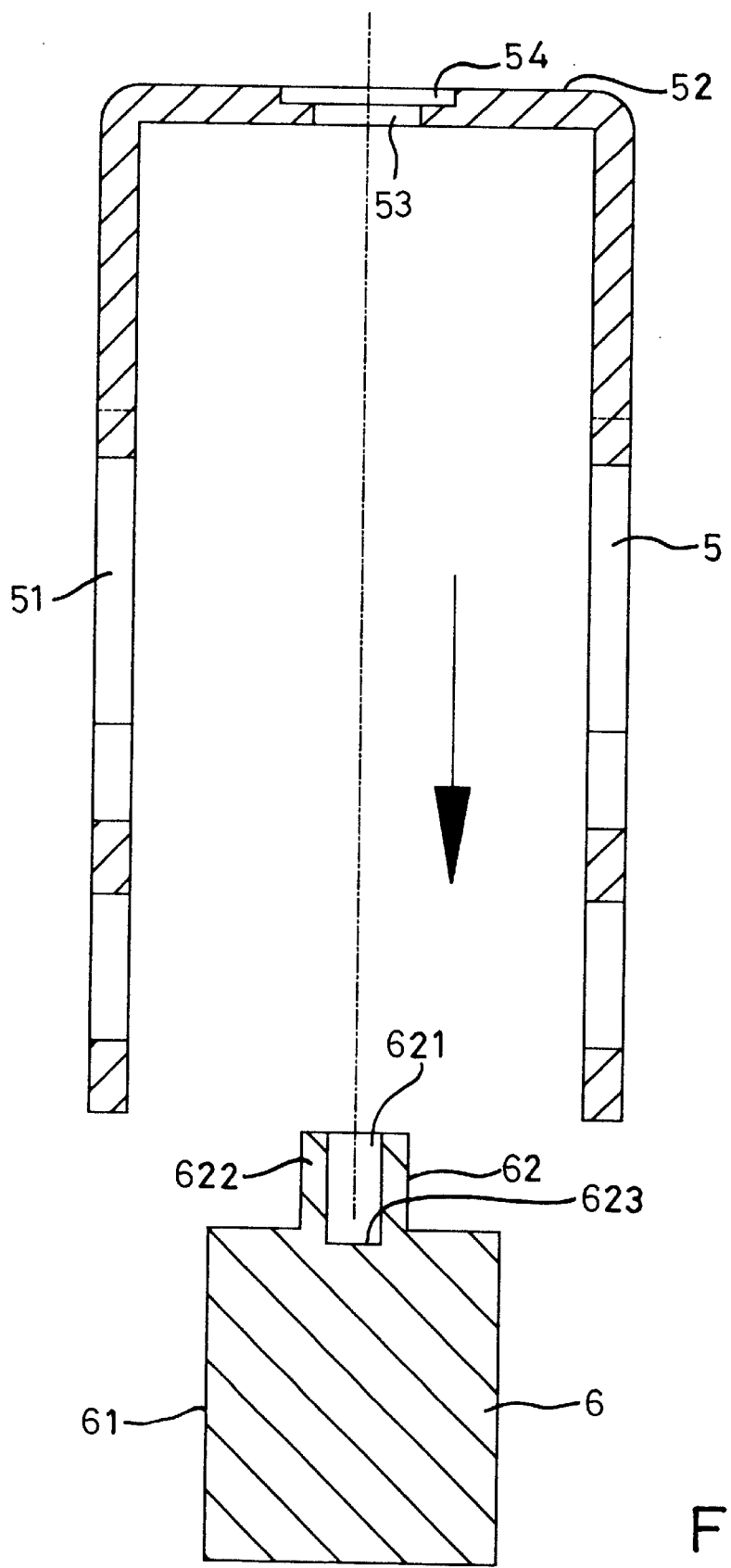
FIG. 10 is a sectional view of the blank sheet shown in FIG. 9 after being bent illustrating the bent blank disengaging with a support.

The frame 5 of the blank sheet as shown in FIG. 9 is made of elongated conductive metal being continuously punched integrally to form four connecting pins 51. These four connecting pins 51 are divided into two sets and one set of these connecting pins 51 has a wider middle plate 52. The middle plate 52 at the center thereof is provided with a fitting hole 53 and a recess ring 54 is provided to surround the fitting hole 53. As shown in FIG. 10, connecting pins 51 are bent vertically and the other set of connecting pins 51 is separate from the middle plate 52 by way of a cut.

Figure 11:
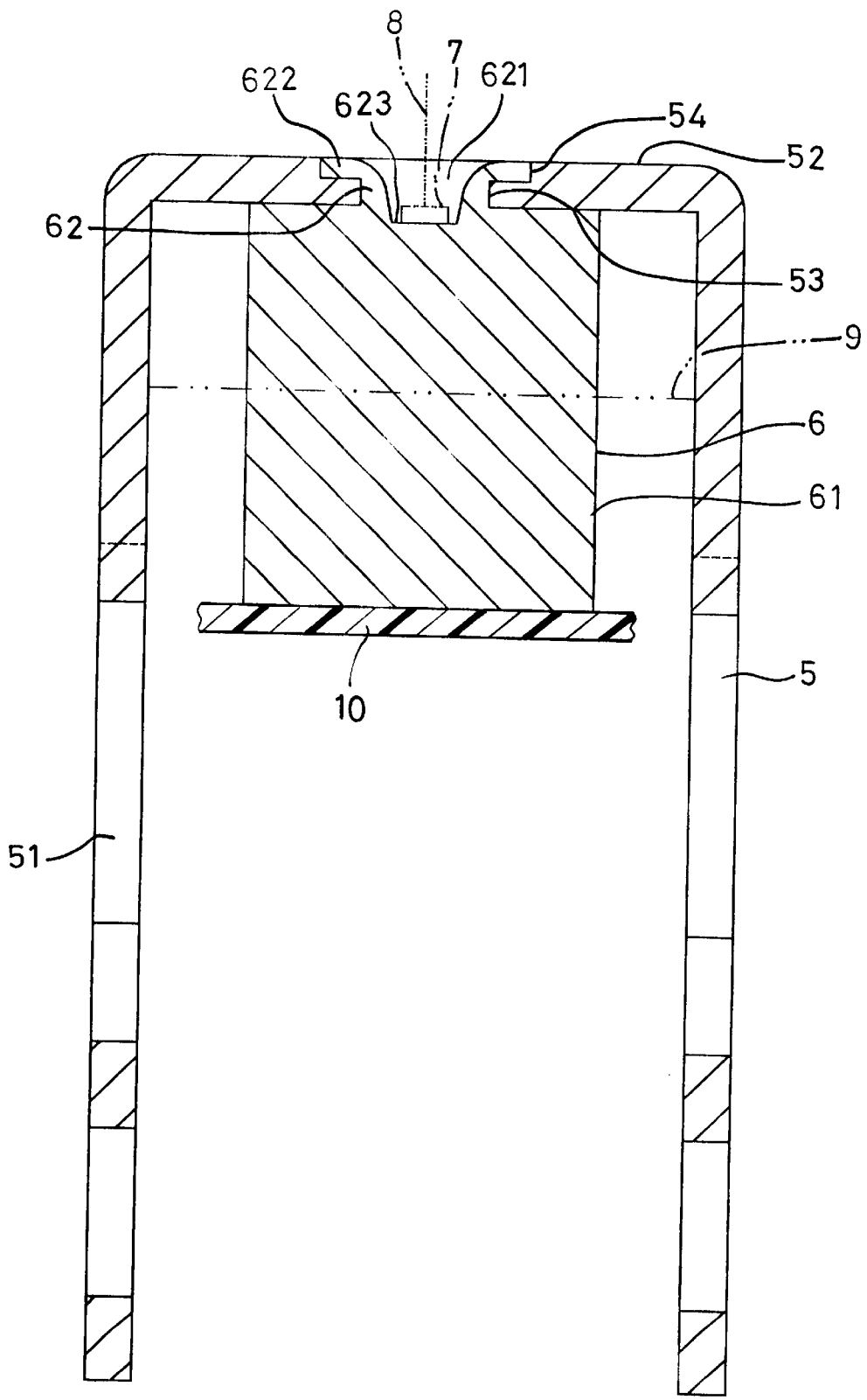
FIG. 11 is a sectional view similar to FIG. 10 illustrating the bent blank engaging with the support.

The support 6 is made of conductive metal and can be hexagon, circle, octagon, and other shapes. The support 6 is composed of a support base 61 and a support tubing 62 and the support base 61 has a bigger size and the support tubing 62 is integrally located at the top of the support base 61. The support tubing 62 has a central hole 621 and a support wall 622 and has an outer diameter corresponding to the fitting hole 53 so as to pass through the fitting hole 53. As shown in FIG. 11, the support engages with the frame 5 by way of riveting, that is, the support tubing 62 is forced to make the support wall 622 be deformed and expand outward so as to attached to the recess ring 54 tightly. The support wall 622 opens upward to constitute a shape of trumpet and the lower part of the support tubing 62 constitute a support bottom 623 for receiving the chip 7.

The chip 7 is the prior art and placed in and located at the support bottom 623.

The wire solder 8 is made of conductive metal and connects with the central part of the one set of the connecting pins 51 and the chip 7 by way of the soldering machine to constitute a closed circuit.

Figure 12:
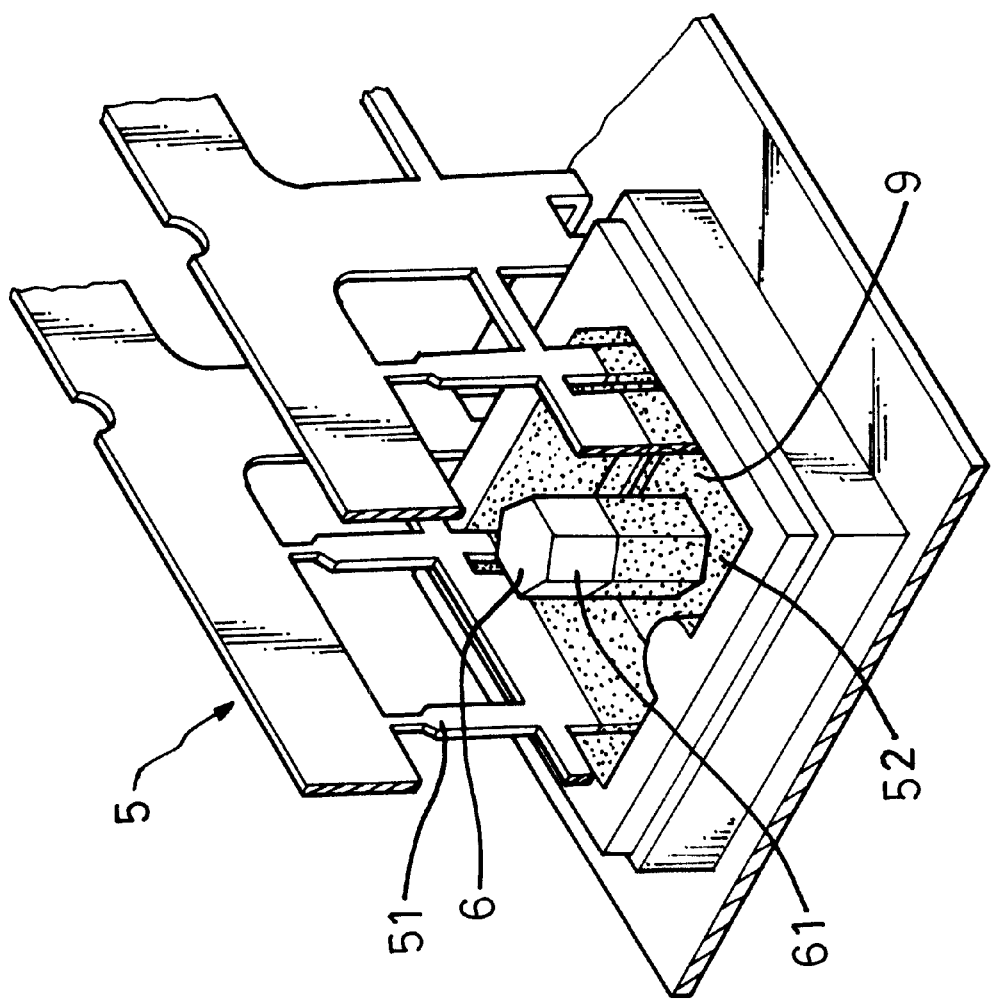
FIG. 12 is a fragmentary perspective view of the light emitting diode in the second embodiment of the present invention in the process of sealing.
Figure 13:
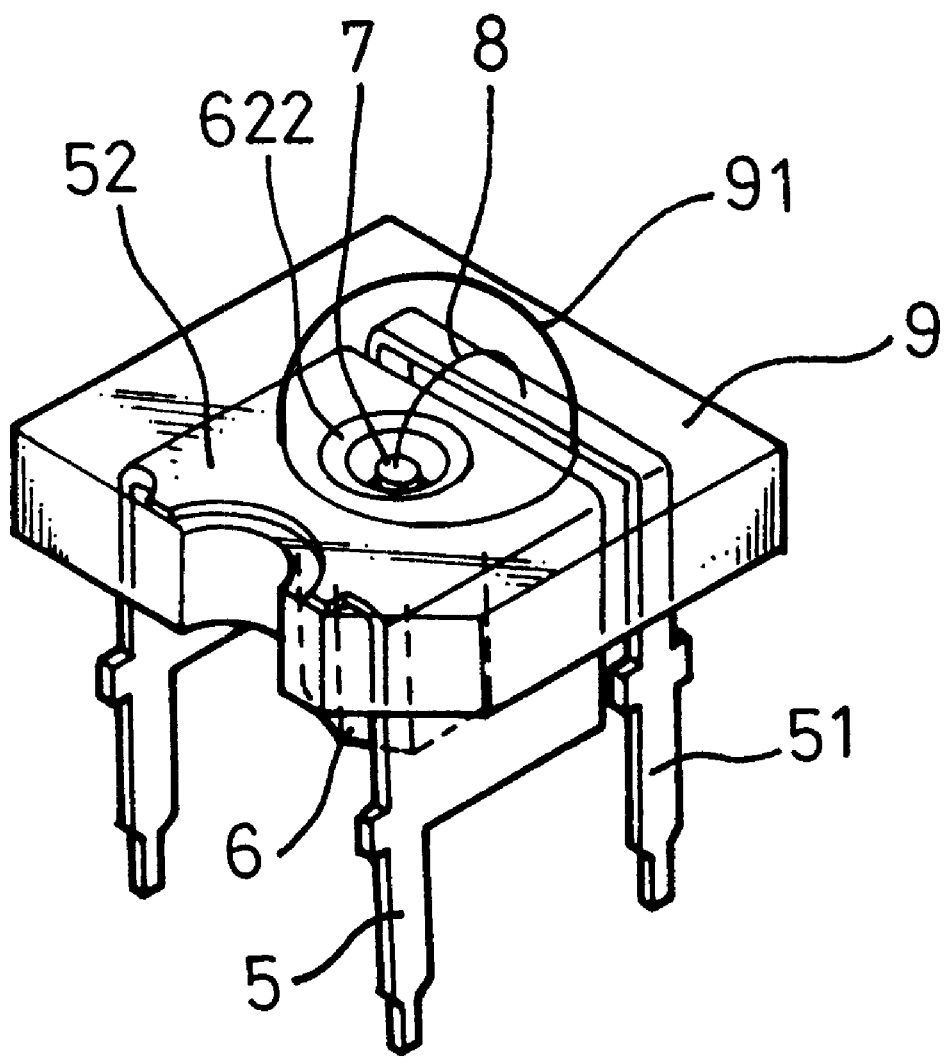
FIG. 13 is a perspective view of the finished light emitting diode of the second embodiment of present invention.

The sealing compound 9 is made of insulation material and encloses tightly the chip 7, the wire solder 8, and part of connecting pins 51 to allow connecting pins to expose outside as shown in FIG. 12. As shown in FIGS. 12 and 13, the sealing compound 9 at the top thereof has a light head 91 extending outward in addition to being an enclosure. The light head 91 may be semi-ellipse but this is not a restriction. Furthermore, the support 6, part of the middle plate 52, and part of connecting pins are exposed outside.

Referring to FIG. 13, the finished light emitting diode in the second embodiment exposes the lower portion of connecting pins, part of the middle plate 52, the lower portion of support 6. The rest of the finished light emitting diode is enclosed tightly by the sealing compound 9. The bottom of support 6 and part of the middle plate expose outside for performing dissipation of heat. In addition, once the finished light emitting diode is inserted to the circuit board 10, the support 6 can contact with the circuit board 10 to carry out the heat transfer for accelerating the dissipation of heat.

Figure 14:
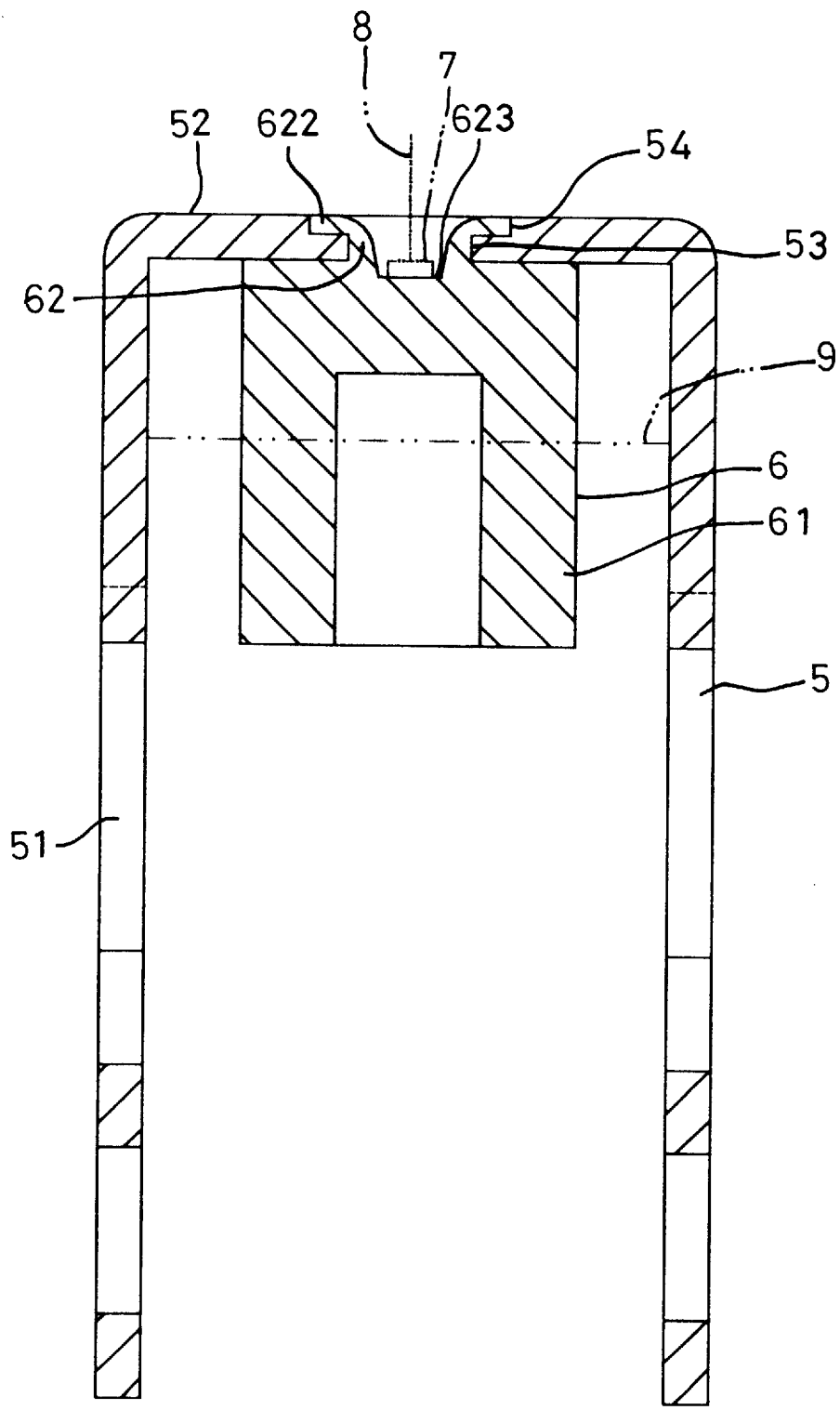
FIG. 14 is a sectional view similar to FIG. 11 illustrating another support engaging with the bent blank.

Referring to FIG. 14, another embodiment of the support 6 is illustrated. The support 6 has the support base 61 thereof provide an annular circumference with a hollow part and the annular circumference contacts with the circuit board for dissipating the heat.

Moreover, the engagement of the support 6 and the frame 5 can be by way of gluing, threaded fastening, and etc. in addition to riveting. Because these equivalent engaging ways are the prior art, no detail will be described further.

Figure 15:
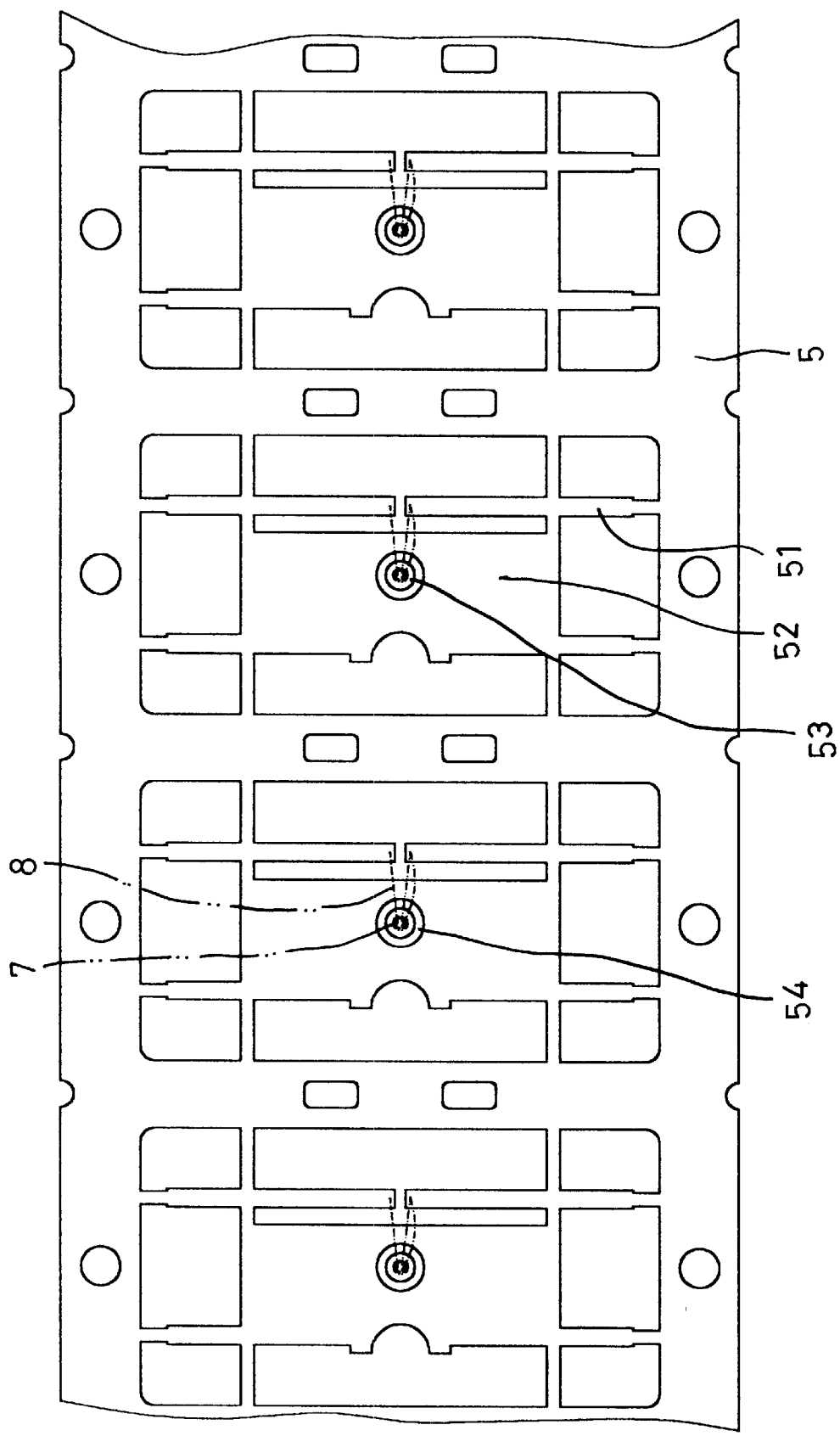
FIG. 15 is a plan view of a blank sheet similar to that shown in FIG. 9 illustrating connecting pin set for crystal chips in different colors.

Referring to FIG. 15, the another set of connecting pins 51 next to the set of connecting pins having the chip 7 is provided with a cut at the middle thereof to connect with chips 7 in different colors. As shown in FIG. 15, while three crystal grains in three different colors such as red, green, and blue or red, yellow, and blue are arranged, the light emitting diode may display a complete combination of different colors. Because this is the prior art, no details will be explained further.

While the invention has been described with reference to preferred embodiments thereof, it is to be understood that modifications or variations may be easily made without departing from the spirit of this invention, which is defined by the appended claims.

What is claimed is:

1. A light emitting diode having improved heat dissipation and comprising:
   a) a U-shaped middle connector having at least one connector extending therefrom, the U-shaped middle connector having a first width;
   b) a U-shaped middle plate having at least one connector extending therefrom, the U-shaped middle plate having a second width greater than the first width and located adjacent to, but spaced from the U-shaped middle connector, a width of the at least one connector extending therefrom being less than the second width of the U-shaped middle plate;

c) a cup recess located completely within the second width of the U-shaped middle plate;

d) a chip located within the cup recess;

e) a wire connected to the chip and to the U-shaped middle connector;

f) an insulation sealing material encapsulating the wire, the chip, the cup recess, at least a portion of the U-shaped middle connector such that the at least one connector is located exteriorly of the insulation sealing material, the insulation sealing material also encapsulating a portion of the U-shaped middle plate having at least said second width such that a portion of the U-shaped middle plate and the at least one connector extending therefrom extends exteriorly of the insulation sealing material to thereby improve heat dissipation; and, g) a support having a first portion attached to the U-shaped middle plate, the cup recess being formed in the first portion of the support, and having a second portion extending exteriorly of the insulation sealing material and acting as a heat dissipater.

2. The light emitting diode of claim 1 wherein the U-shaped middle connector has two connectors extending therefrom.

3. The light emitting diode of claim 2 wherein the U-shaped middle plate has two connectors extending therefrom.

4. The light emitting diode of claim 1 wherein the U-shaped middle plate has two connectors extending therefrom.

5. The light emitting diode of claim 1 wherein the second portion of the support has a generally cylindrical configuration.

6. The light emitting diode of claim 1 wherein the second portion of the support has an end and further comprising a recess extending into the second portion from the end.

7. The light emitting diode of claim 1 further comprising:

a) at least one gap in the U-shaped middle connector separating the U-shaped middle connector into at least two sections;

b) at least two chips in the cup recess; and, c) wires connecting each of the at least two chips to one of the at least two sections.

* * * * *